United States Patent [19]

Leeb et al.

[11] Patent Number: 5,717,325
[45] Date of Patent: Feb. 10, 1998

[54] MULTIPROCESSING TRANSIENT EVENT DETECTOR FOR USE IN A NONINTRUSIVE ELECTRICAL LOAD MONITORING SYSTEM

[75] Inventors: Steven B. Leeb, Belmont, Mass.; Umair A. Khan, Santa Clara, Calif.; Steven R. Shaw, Cambridge, Mass.

[73] Assignee: Massachusetts Institute of Technology, Cambridge, Mass.

[21] Appl. No.: 583,584

[22] Filed: Jan. 5, 1996

Related U.S. Application Data

[63] Continuation-in-part of Ser. No. 217,488, Mar. 24, 1994, Pat. No. 5,483,153.

[51] Int. Cl.[6] .................................................. G01R 19/06
[52] U.S. Cl. .............................. 324/76.12; 324/76.13; 324/102; 324/618; 364/487
[58] Field of Search ..................................... 324/102, 615, 324/618, 76.12, 76.13; 364/481, 483, 487, 553

[56] References Cited

U.S. PATENT DOCUMENTS

| | | | |
|---|---|---|---|
| 4,821,562 | 4/1989 | Inoue | 324/76.12 X |
| 5,170,359 | 12/1992 | Sax et al. | 364/481 |
| 5,337,013 | 8/1994 | Langer et al. | 324/537 |
| 5,400,261 | 3/1995 | Reynolds | 364/487 |
| 5,483,153 | 1/1996 | Leeb et al. | 324/76.12 |

Primary Examiner—Glenn W. Brown
Attorney, Agent, or Firm—Flehr Hohbach Test Albritton & Herbert LLP

[57] ABSTRACT

A multi-processing transient event detector for use in a nonintrusive electrical load monitoring system has been provided. Templates of transient pattern data associated with each electrical load which may be monitored are stored. Such templates are then used to match and correlate with the actual monitored transient pattern data at the load site. The decomposition in which time scales are changed is accomplished in parallel along with one or more parallel event detection processing modules for each decomposition.

9 Claims, 11 Drawing Sheets

MULTIPROCESSING TRANSIENT EVENT DETECTOR FOR USE IN A NONINTRUSIVE ELECTRICAL LOAD MONITORING SYSTEM

RELATED APPLICATIONS

This application is a continuation-in-part of application Ser. No. 08/217,488 filed Mar. 24, 1994 and now U.S. Pat. No. 5,483,153, issued Jan. 9, 1996.

The present invention is directed to a multi-processing transient event detector for use in a nonintrusive electrical load monitoring system.

BACKGROUND OF THE INVENTION

As discussed in the above patent, a NONINTRUSIVE LOAD MONITOR (NILM) is a device that monitors the utility service entry of a building and, from measurements of voltage and aggregate current made solely at this point, is able to determine the operating schedule of every load of interest in the building. Nonintrusive load monitoring is a convenient and economical means of acquiring energy data for this purpose. Compared with conventional load monitoring, nonintrusive monitoring boasts easier installation, simplified data collection and simplified data analysis because the NILM allows for all analysis to be done at a single central location.

An essential portion of the NILM is a transient event detector (TED) which identifies load transients or transient sections. These may be characterized as start-up transient patterns where a unique pattern is associated with each load being monitored, and the pattern being related to a particular harmonic content of the periodic waveform which is analyzed by Fourier techniques well known in the art. These transients, since they involve a significant variation from steady state, are termed v-sections.

The basis for the TED is the observation that transient behavior of most important load classes is distinctive and repeatable. This allows reliable recognition of individual loads from the observed transients. Each transient in real and reactive power and harmonics of current may be considered for pattern matching as is, or subdivided into segments of significant variation, known as v-sections. A load may thus be modeled as a set of v-sections comprising its characteristic transient behavior. Detecting the turning on of a load would simply (and reliably) mean recognizing all the v-sections for the load in the input data. This pattern recognition may be done using any feasible pattern discrimination technique such as a Euclidean filter or a Transversal filter.

The use of such v-sections is disclosed and claimed in the above parent patent. Previous monitoring devices depended upon changes in steady state real and reactive power, a method which had severe limitations in the context of industrial settings having complex loads.

In order to reliably compare a monitored transient pattern or v-section with a known stored pattern (which indicates a specific load), part of the detection process involves the examination of input data on multiple time scales in addition to multiple loads. Thus there arises a specific problem of processing time for start-up load transient pattern data; that is, the data at the start-up where several loads may be involved having a complex harmonic content. Here varying time scales are necessary to match the monitored event with a stored template of a known start-up transient pattern. Even if only a single time scale could be used there is still the problem of multiple loads. Of course, the monitored data can be stored and processed offline. However, this would require extensive computer memory and capacity and a long processing time. Real time operation is desired with a system which is inexpensive and commercially viable.

OBJECT AND SUMMARY OF THE INVENTION

Therefore an object of this invention is to provide a transient event detector for use in a nonintrusive electrical load monitoring system.

In accordance with the above object the present invention provides a multi-processing transient event detector for use in a nonintrusive electrical load monitoring system at the monitored site having a plurality of electrical loads where start-up transient pattern data associated with each electrical load being monitored has been previously stored, the power transient data corresponding to approximate envelopes of harmonic content of observed current or voltage waveforms produced by the plurality of electrical loads.

The detector comprises data monitoring means for continuously monitoring total load pattern data at the site, the load pattern data corresponding to an aggregation of the envelopes of harmonic content, in parallel to provide a plurality of data streams, each data stream having a unique load pattern related to a particular said harmonic content. For each data stream there is provided in parallel a decomposition with a plurality of single processor units, each decomposition processor unit having a unique time scale to provide a corresponding envelope. For each parallel decomposition processor unit there is at least one event detection processing module for processing the corresponding envelope having a unique time scale for correlation or matching with a particular stored start-up transient pattern associated with the electrical load being monitored whereby said electrical load is identified.

DETAILED DESCRIPTION OF PREFERRED EMBODIMENTS

Figure 1:
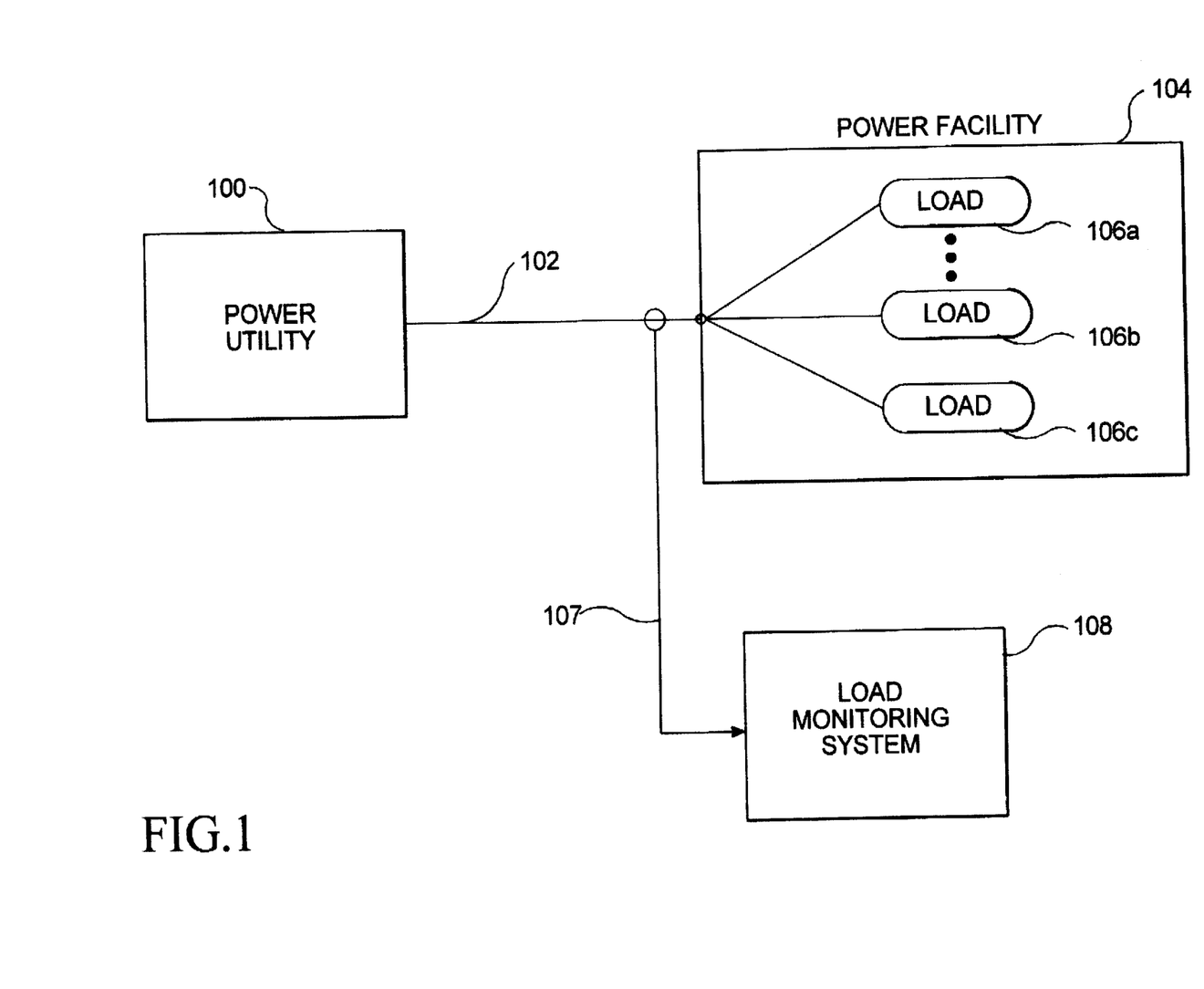
FIG. 1 is a block diagram of a nonintrusive load monitoring system in accordance with the present invention.

FIG. 1 illustrates the context of the present invention where the load monitoring system 108 of the present invention monitors an industrial power facility 104 which has a plurality of electrical loads 106a, 106b and 106c, etc. Each load of course has its unique start-up power transient pattern. The power utility 100 provides power via the power line 102. Since by definition the load monitoring system is nonintrusive it is connected to the entrance of the power facility (or at least a single connection serving one or more loads).

Figure 2:
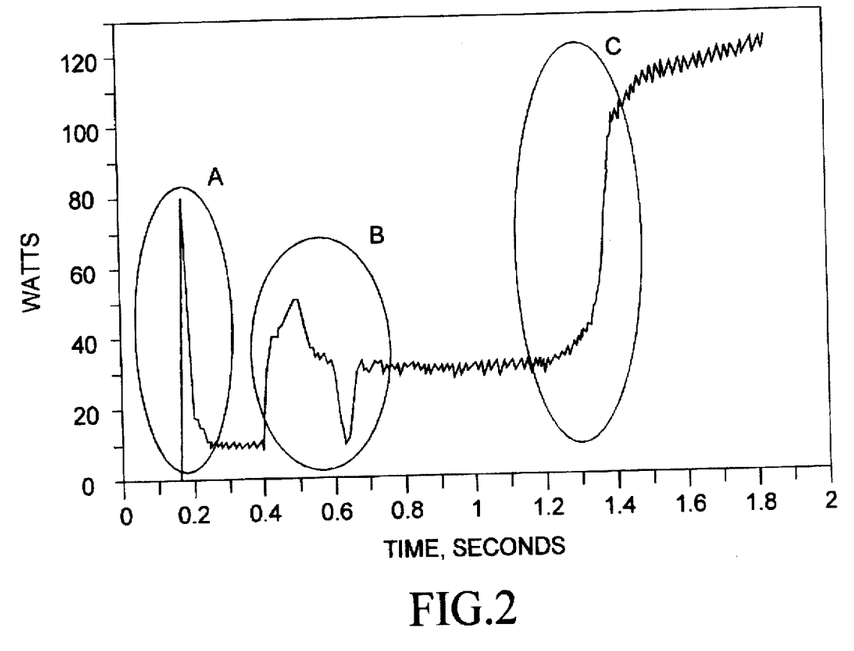
FIG. 2 shows a trace of the envelope of real power during the turn-on transient of a rapid start fluorescent lamp bank.
Figure 3:
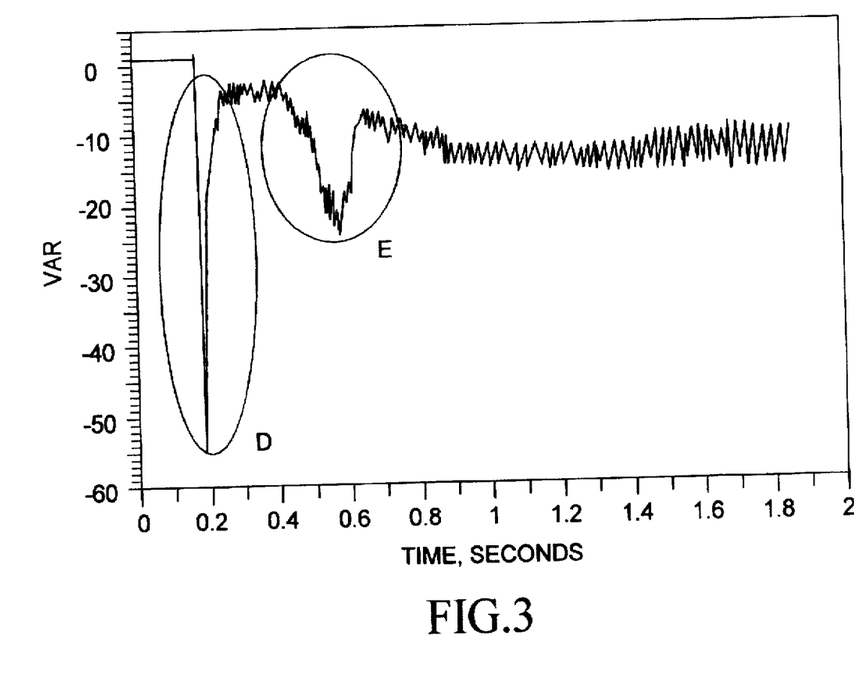
FIG. 3 shows a trace of the envelope of reactive power during the turn-on transient of the same rapid start fluorescent lamp bank.

FIGS. 2 and 3 illustrate the type of start-up transient data or v-sections which can represent a specific electrical load. These represent the turn-on transient of a rapid start fluorescent lamp. FIG. 2 is an envelope of real power and FIG. 3 is reactive power. The locations of the v-sections are illustrated by the ellipses labeled A–E in FIGS. 2 and 3. These v-sections were previously stored or detected during a training phase before installation or onsite. And they are stored in the form of templates of segments of waveforms of a specific harmonic content. Other harmonic content waveforms of interest besides the start-up power waveforms include, for example, third and fifth harmonic waveforms.

As discussed in the above patent, although there might be overlap between v-sections of one load transient and another by considering the transients as sets of v-sections rather than a single event, reliable and accurate identification is maintained. In fact, as discussed in the above patent, by the use of intrascale and interscale lockouts, where the pattern search is made on a hierarchical basis where the most complex transients are searched first, if a complex transient is detected, the identification of a less complex pattern will not be allowed. In other words, this record is locked out. Thus, this presents erroneous load identifications.

Figure 4:
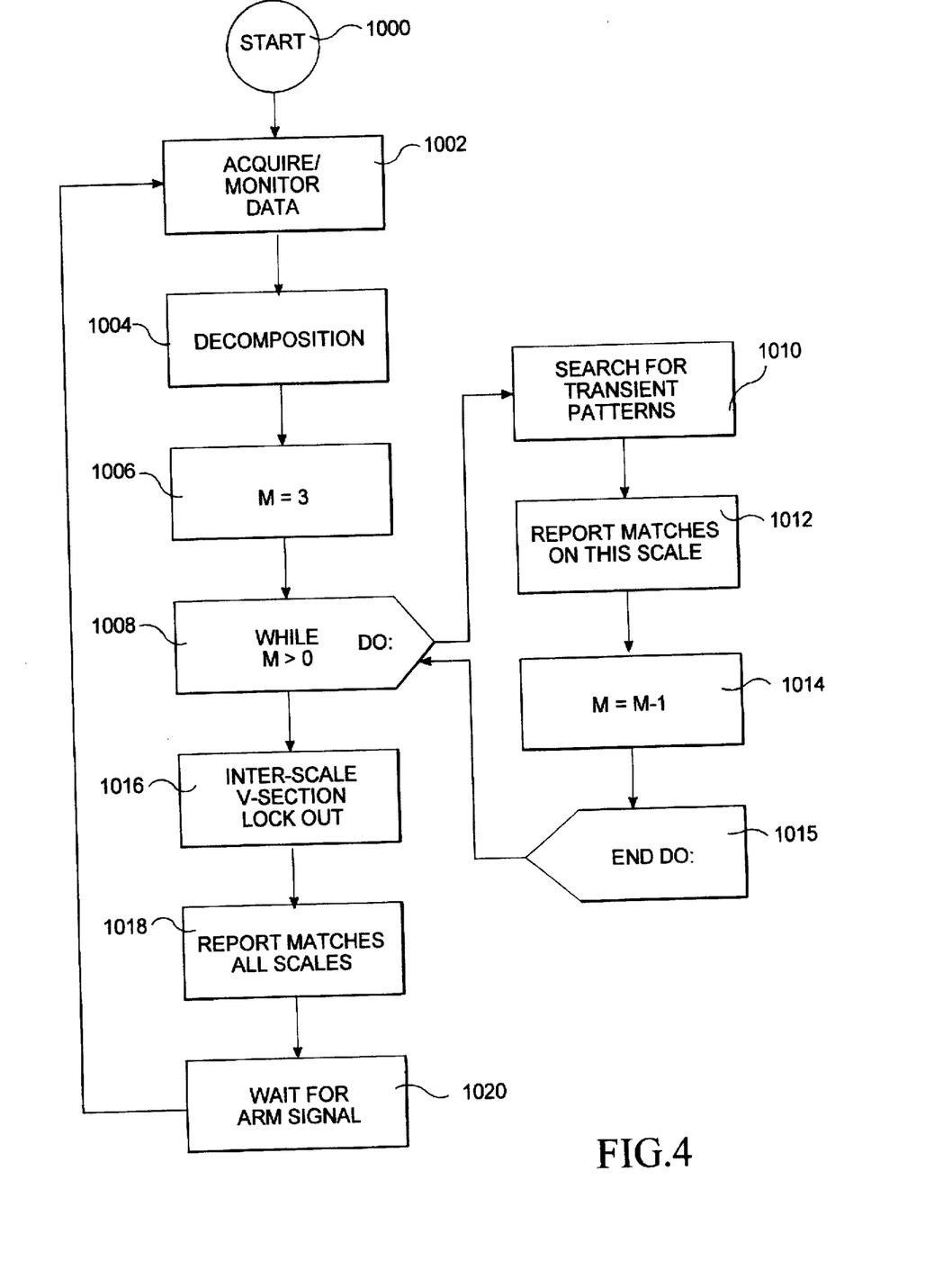
FIG. 4 is a flow chart of the method of the invention disclosed and claimed in the above patent showing a sequential processing method.

FIG. 4 is a flow chart of the complete process carried out by a load monitoring having a transient event detector but in a sequential form as disclosed and claimed in the above patent. The present invention utilizes this flow chart but implements it in a parallel processing format. However, FIG. 4 will be first discussed sequentially to provide a background for the parallel processing. FIG. 4, of course, is discussed and described in the above patent.

The flow chart of FIG. 4 as well as providing for real time load identification may be also utilized to initially acquire data (see Step 1002). Here the v-sections of known loads are collected separately and stored as templates. It is against these templates that input data streams are searched and matched.

Thus the process starts as indicated by the START bubble in the flow chart (Step 1000). After templates are acquired it can be assumed input data is monitored (Step 1002). Total starting load pattern transient data is monitored which corresponds to an aggregation of envelopes of harmonic content. As is discussed in the above patent, well known Transversal filtering is used to detect v-sections in the input data stream.

Next as also discussed in the above patent in Step 1004 a tree-structured decomposition is performed on the data stream. In effect this is time scaling the input data stream. Decomposition includes digital low pass filtering and a decimation in time. As a practical matter, as indicated by the scale factor in Step 1006, initially where M=3, this is the scale step which corresponds to, for example, an initial sampling of 512 sample points. And then this is counted down to M=1 which is the coarsest scale.

A loop in the program flow at Step 1008 controls the search for patterns over all three scale steps. At Step 1010, a pattern search is initiated and at 1012 any v-sections associated with all of the previously stored known transient events are compared. Each iteration of the loop focuses on a single scale. The search is hierarchical where the event detector searches for the most complex transient patterns first. When all of the v-sections for a pattern are found, the complete transient pattern is presumed to be present and the event is recorded.

Intrascale lockout is performed for each scale and if a complex pattern is found in the input data, the location of the v-sections of the pattern is recorded. The identification of any subsequent, less complex patterns will not be permitted or locked out. If a very complicated v-section set associated with a certain pattern is found in the data, the likelihood that the transient associated with the pattern is actually present is relatively high. This helps to compensate for overlap of v-sections. If a match or identification occurs in Step 1012, then the scale counter M is decremented in Step 1014 and the loop is repeated until all other scales have been searched; then it is ended in Step 1015.

An interscale lockout is performed in Step 1016 which follows on the same principle of the intrascale lockout. This ensures that v-sections from a complex but coarse time scale (M=1) were not used to match a less complicated, finer scale pattern. Finally all matches are reported at Step 1018 and another ARM or enabling signal is awaited at Step 1020.

Figure 5:
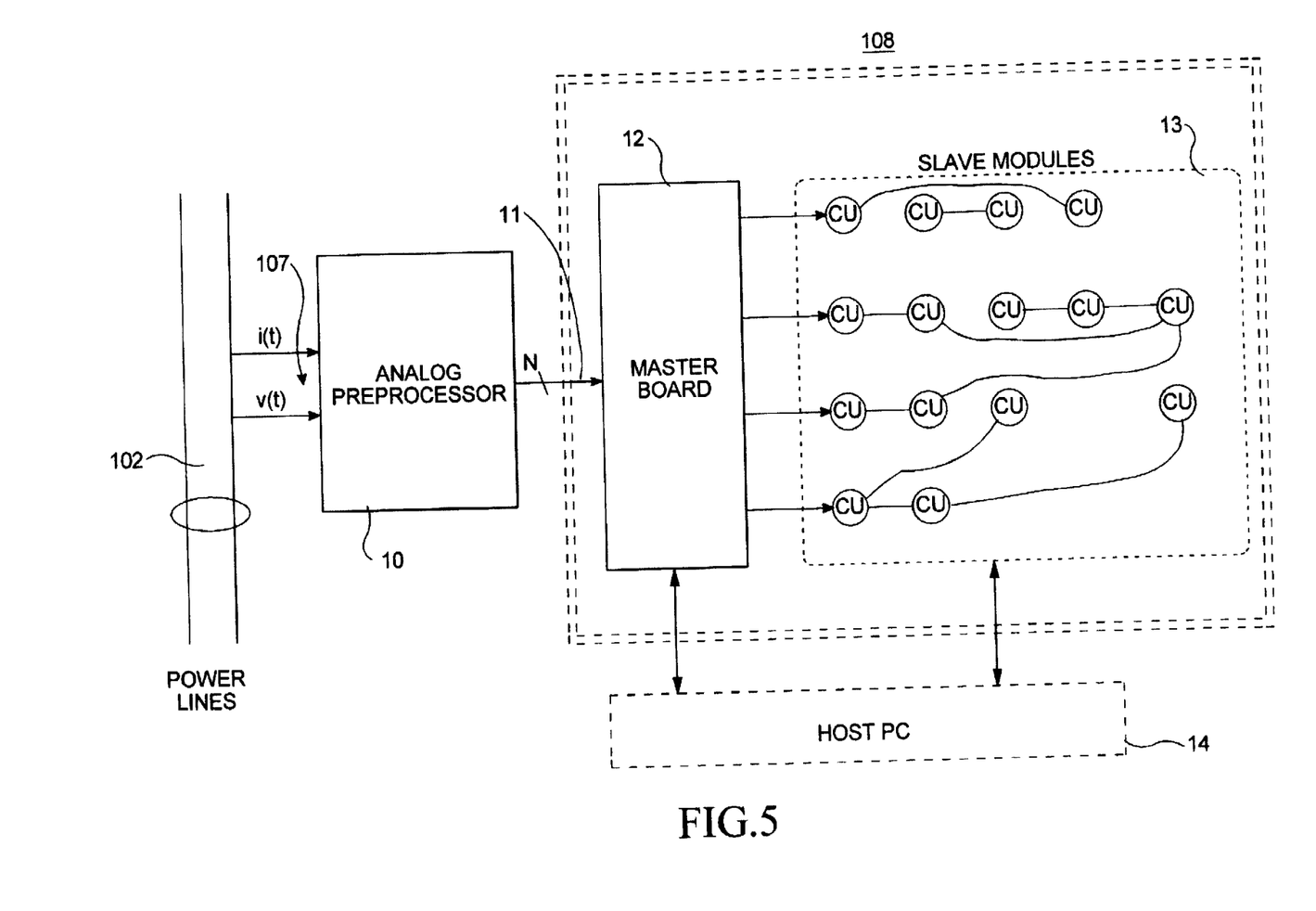
FIG. 5 is a simplified block diagram showing a generalized load monitor embodying the present invention.

FIG. 5 illustrates the format of the load monitor of the present invention in the form of a machine model. It includes an analog preprocessing unit 10 connected to power lines 102 with Hall effect pickups of voltage current as illustrated at 107. It continuously monitors the total power load transient data at the site to which the power lines 102 are connected.

Analog preprocessor 10 continuously monitors total power load pattern transient data at the site. Such load pattern data corresponds to an aggregation of envelopes of harmonic content. A plurality of N data streams on a line 11 are provided, each data stream having a unique power load pattern related to a particular harmonic content. Such analog processor is illustrated in the above patent. In general in the present invention, at least four (N) data streams may be provided where one has harmonic content indicating real in-phase power, the next reactive quadrature power, and then in-phase harmonics including the third and fifth are provided. The above processing is accomplished by well known Fourier analysis.

The analog outputs of the preprocessor are, as discussed above, estimates of the envelopes of real and reactive power as well as in-phase harmonic content such as the third and fifth harmonics and other useful harmonics. In general the processor is discussed in detail in a paper and presentation given at Galway, Ireland in 1994 at the University's Power Engineering Conference (UPEC) by S. B. Leeb and S. R. Shaw entitled "Harmonic Estimates for Transient Event Detection".

Line 11 (which is a high capacity parallel data line) is coupled to a master board 12. Connected to master board 12 is a mesh of slave modules or computation units (CU) 13. As will be discussed below these computation units are programmable and configurable to selectively provide alternate functions such as the event detection and decomposition discussed in conjunction with FIG. 4. Both master board 12 and slave modules 13 are coupled to the host PC (personal computer) 14.

Figure 9:
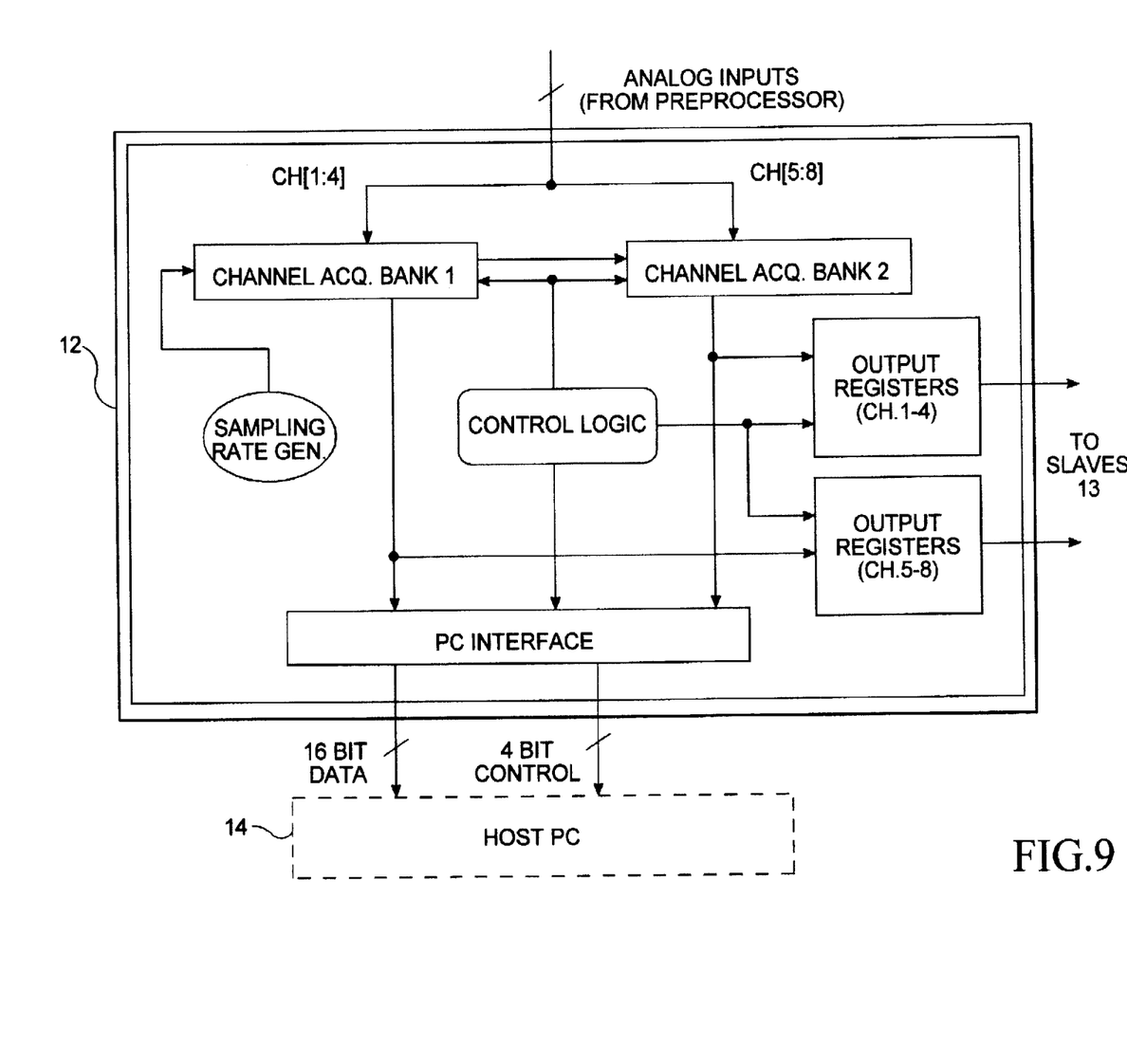
FIG. 9 is a block diagram illustrating in detail the operations of FIGS. 7 and 8 and also illustrates a portion of FIG. 5.

The master board 12 as illustrated in detail in FIG. 9 is the data acquisition subsystem of the load monitoring system. The analog inputs from the preprocessor are digitized, stored in RAM and periodically transferred as data blocks to the slave modules. The master board interfaces with a host personal computer 14.

Figure 10:
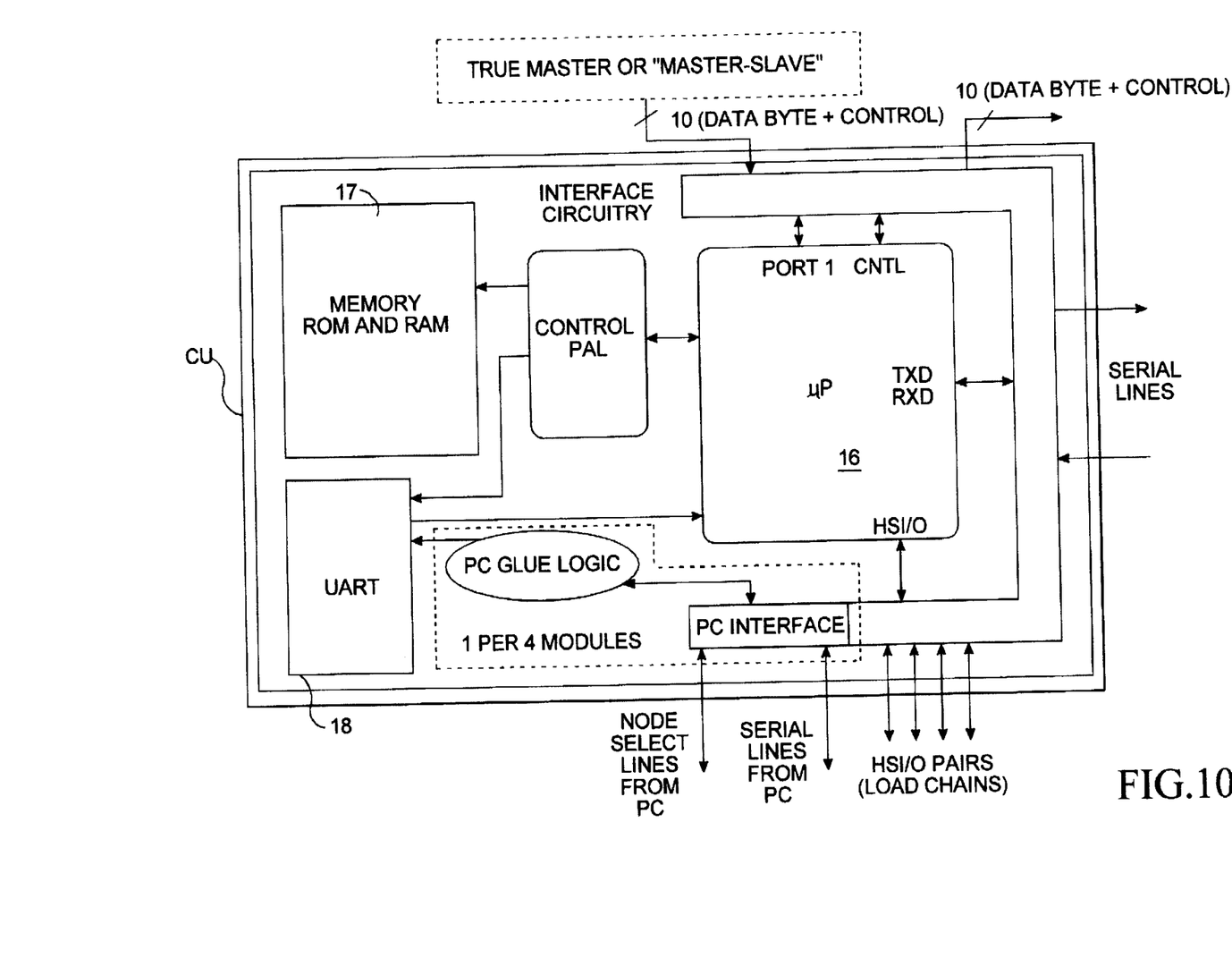
FIG. 10 is a block diagram illustrating another portion of FIG. 5 and the processes illustrated in FIGS. 7 and 8.

FIG. 10 shows a typical slave module or computational unit (CU) which operates in parallel and communicates with one another. The slave module is the primary computational unit of the load monitor. It includes a microprocessor 16 (for example, an Intel80C196KC), read only and a random access memory 17, an external UART 18 and other suitable logic.

Figure 6:
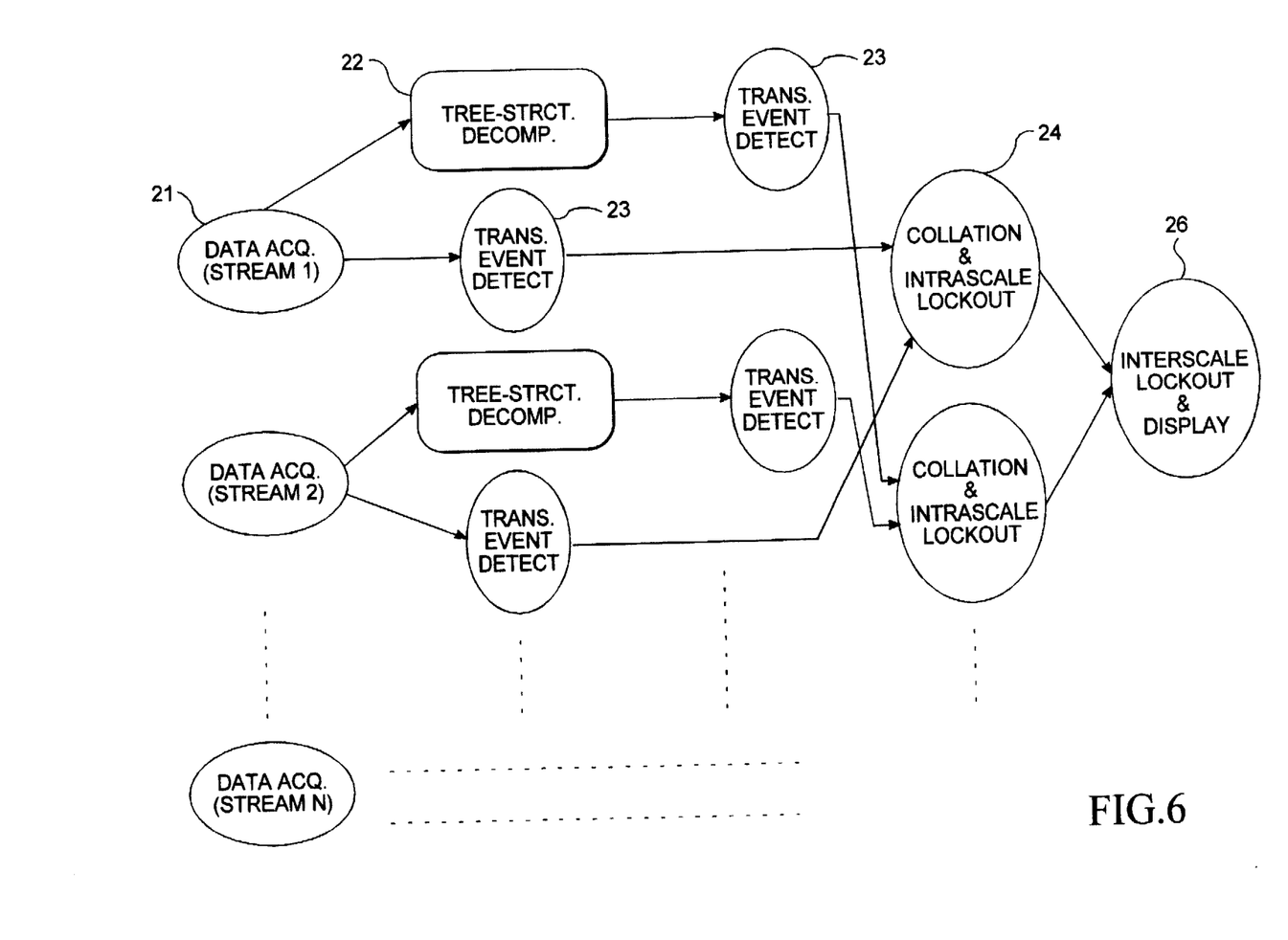
FIG. 6 is a data dependency graph useful in understanding the present invention.
Figure 7:
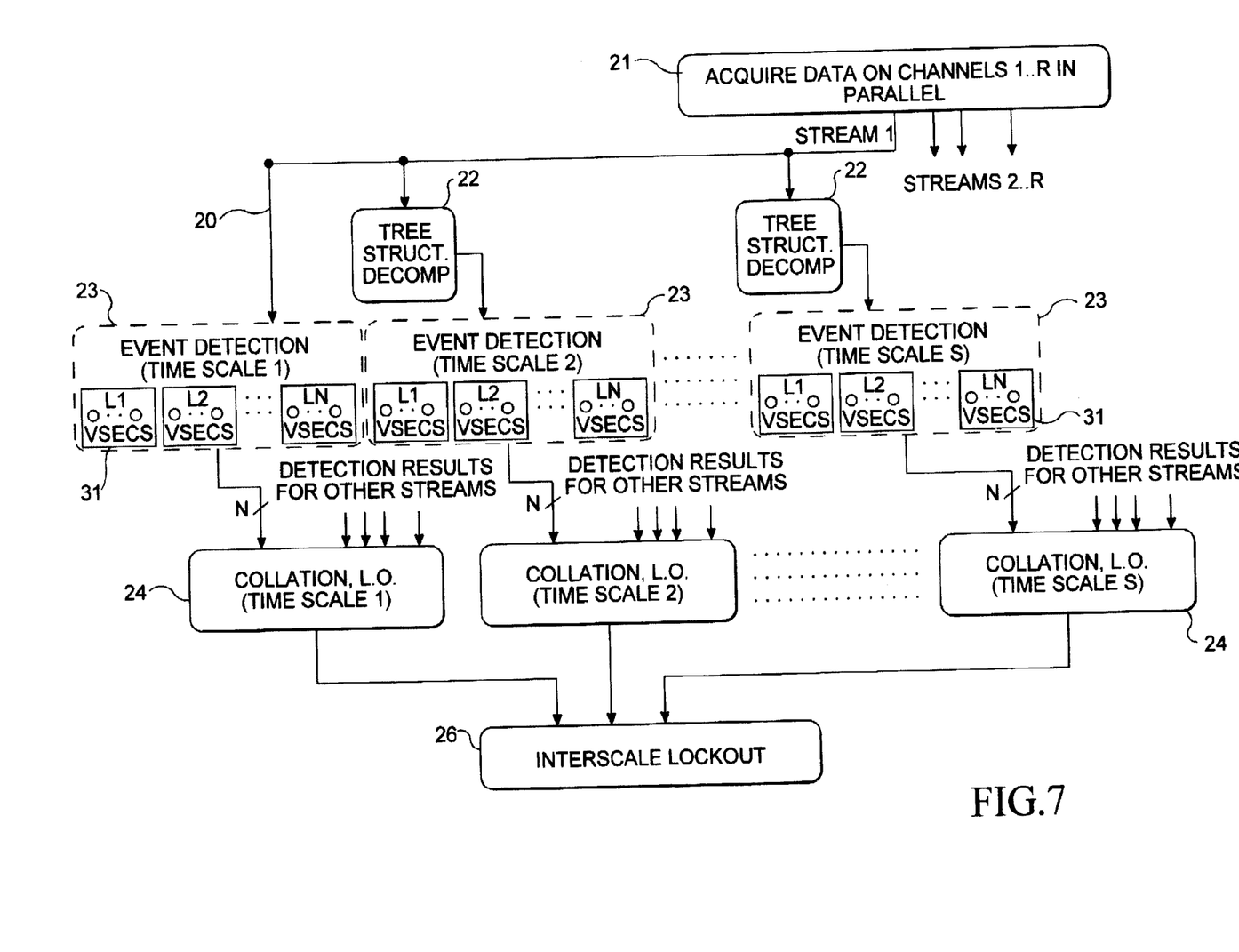
FIG. 7 is a block diagram illustrating in broad detail the detector embodying the present invention and which implements the flow chart of FIG. 4 in a parallel processing mode.
Figure 8:
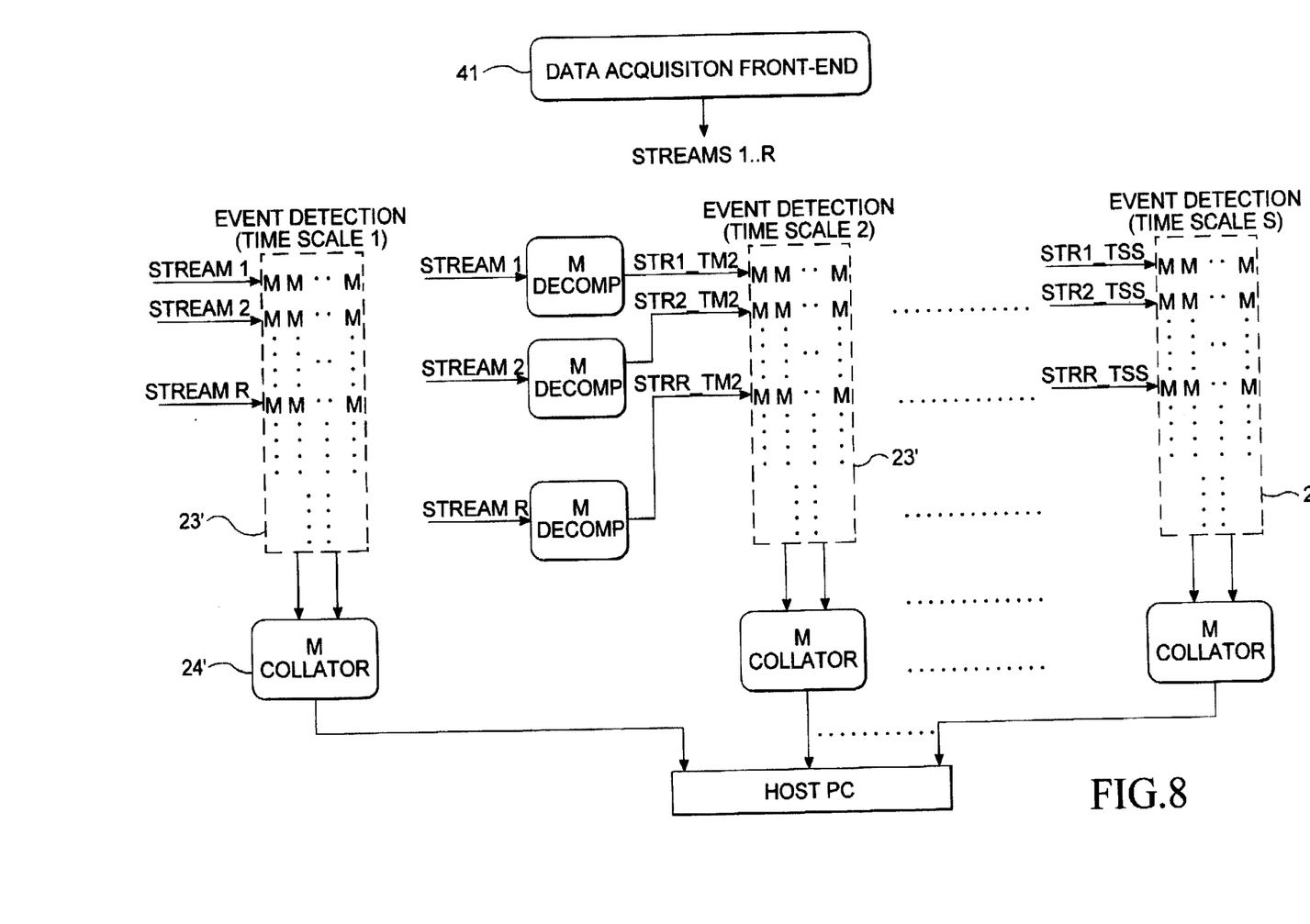
FIG. 8 is a block diagram like FIG. 7 but in another format.

However from a theoretical standpoint, FIGS. 6, 7 and 8 illustrate the technique and processing concept of the present invention. FIG. 6 is a data dependency graph which is based on the functions of FIG. 4. Thus in the blocks 21 is the data acquisition or monitoring of Step 1002; block 22 corresponds to the data acquisition Step 1004 and transient event detection 23, the loop including Steps 1008 through 1015. Then there is the collation and interscale lockout 24 corresponding to Step 1012 and interscale lockout and display 26 corresponding to Steps 1016 and 1018. The collation step merely refers to the recording of the storage of the positive identification of electrical loads from the event detecting processing modules. For parallel processing the independency of operations must be established. Thus the graph of FIG. 6 states that the following operations are independent:

The operations of data acquisition, tree-structured decomposition, and event detection can be performed on each data stream independently.

For a given time scale:
All result collation and intrascale lockouts may be performed independently.

For a given data stream:
All tree-structured decomposition operations can be performed independently.

All operations (event detection, collation and intrascale lockout on different time scales may be performed independently.

The foregoing thus provide guidelines by which to parallelize the event detection process. These are the following guide lines:

1. Data acquisition (monitoring) is performed on all input streams in parallel.
2. The following operations are performed in parallel:
    a) Event detection on the original time scale is performed on all data streams in parallel. Each load's transients on every stream are searched for in parallel. In addition, the v-sections for a given load on a given stream are searched for in parallel.
    b) Tree-structured decomposition is performed on all the streams in parallel.
3. Event detection on all the time scaled data streams is performed in parallel in the same manner as for the original data streams.
4. Collation and intrascale lockout is performed on each time scale in parallel.
5. Interscale lockout is performed on the results of the collators.

There is considerable freedom in mapping the foregoing guidelines into an abstract model for a multi-processing transient event detector. Thus just because two operations can be done in parallel does not mean they have to be done in parallel. In defining a practical load monitoring system, the necessity of a reliable economical implementation should be kept in mind. The above guidelines are illustrated by the flow chart of FIG. 7 which is in effect a hardware diagram for the previously described computational units for a slave module of FIG. 5. In other words, it describes the possible parallel connections.

Referring to block 21, the data acquisition or monitoring from the analog preprocessor 10 provides a number of data streams designated 1 through R. Each data stream relates to a particular harmonic content such as real power, reactive power, or third or fifth harmonic, for example. Thus with respect to the data stream 1, which is typical, a direct line 20 is indicated as going to an event detection unit 23 which will perform, referring to FIG. 4, the loops 1008 through 1015; that is a search for transient patterns on a particular time scale and a report on matches.

Note that referring to FIG. 6, the same legends are given for event detection 23, acquisition data of 21, and also tree-structured decomposition 22. Thus with regard to data stream 1, decomposition 22 is used to provide different time scales. And this is indicated by an event detection unit 23 designated "time scale 2" and a third unit with "time scale S" to generalize the situation. Within each detection unit 23 there may be individual load processing or matching units 31 for each type of load, L1–LN. In normal situations this might be accomplished by a signal load detection computational unit. Finally the units 24 are collation and intrascale lockouts (L.O.) each dedicated to a particular time scale. Unit 26, referring again to FIG. 6, provides interscale lockout in the final collation of the overall results for all loads and all time scales. Thus with relation to the computational slave modules or processing modules, the following is provided:

1. Each processing module works on an input data stream.
2. Each processing module is assigned exactly one of three functions which are (a) tree-structured decomposition (b) search input stream for v-sections belonging to one or more loads and (c) collation of event detection results on a given time scale.
3. Interscale lockout is performed by the host PC.

FIG. 8 is based on FIG. 7 but a more practical implementation. Here a data acquisition front end 41 receives all input streams and after analog processing relays the data blocks to the event detection processing modules 23'. Tree-structured decomposition is performed on each data stream independently by the units 22. Event detection on the original time scale, (see the left block 23') occurs as soon as the front end shifts new data with the other scales being done on the completion of decomposition. Collation and intrascale lockout are performed independently of each time scale indicated by the collators 24'.

Figure 11:
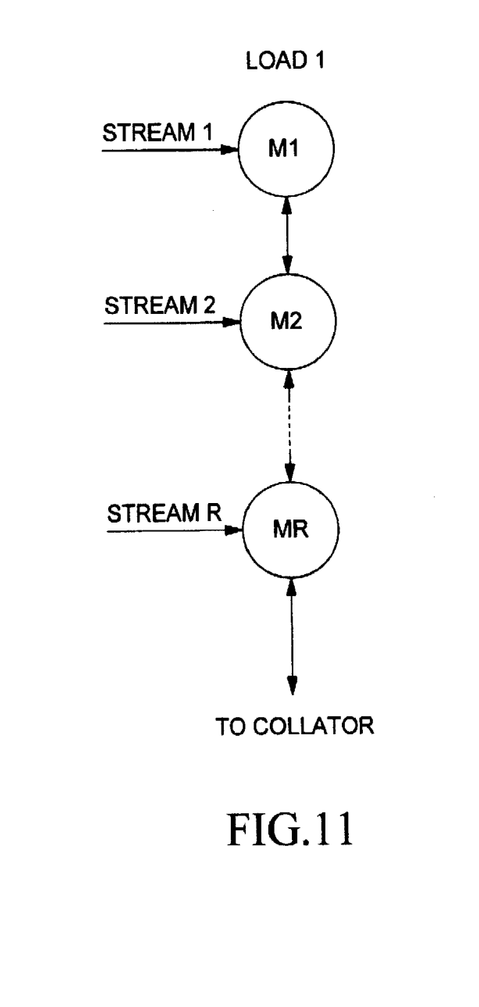
FIG. 11 is a simplified flow chart illustrating a process of the present invention and effective hardware connections.

FIG. 11 illustrates the solving of the practical task of identifying one load on one time scale. Assume that a load has transient v-sections on its streams 1 through R. Computational module M1, searches stream 1 for v-sections present in that stream. Upon detecting all v-sections, it signals M2 which has been searching. The detection results are thus passed down this linear chain. When all modules, including the final processor MR, have identified their v-sections, the load is considered identified on the given time scale, and the match is sent to the collator for that time scale.

Figure 12:
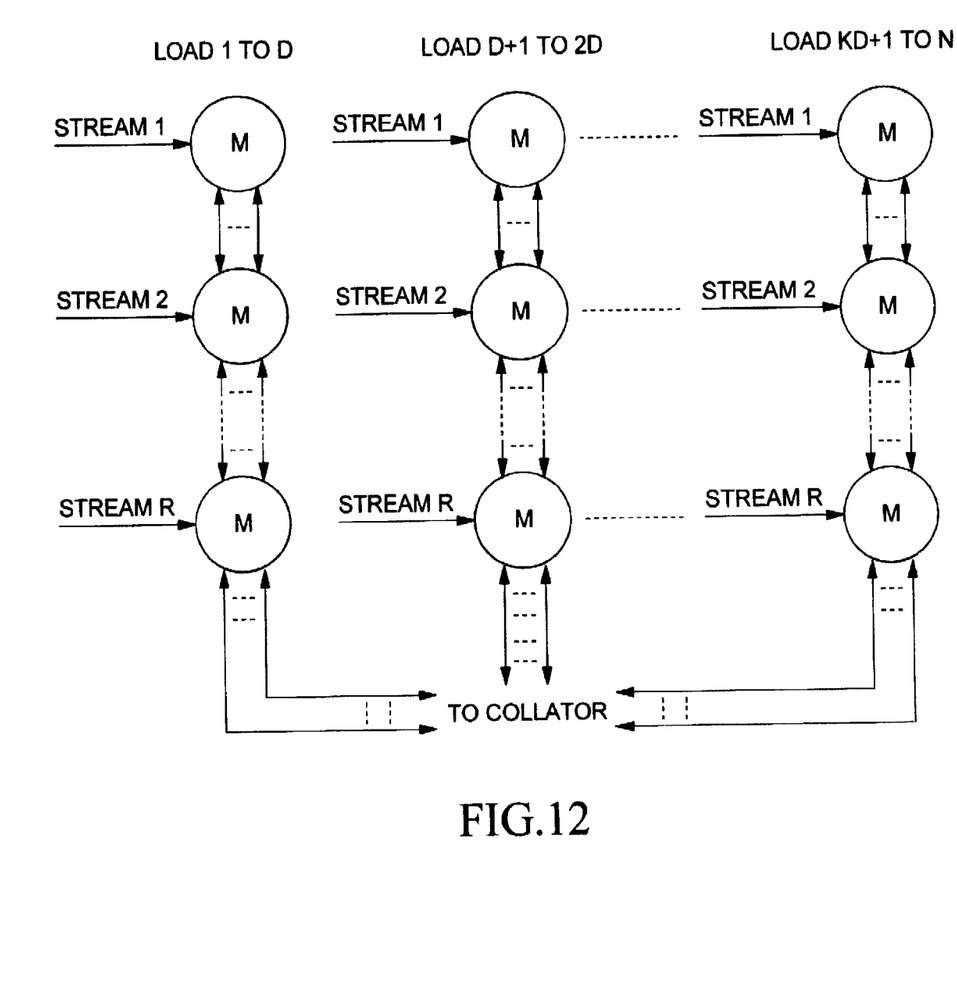
FIG. 12 is a flow chart illustrating FIG. 11 in a more complex form.

FIG. 12 is a complex situation showing the identification of N loads on a particular time scale with the v-section search being conducted on all R streams. And this operates in the same manner as above in that identification messages are propagated down the columns to the final collator.

Figure 13:
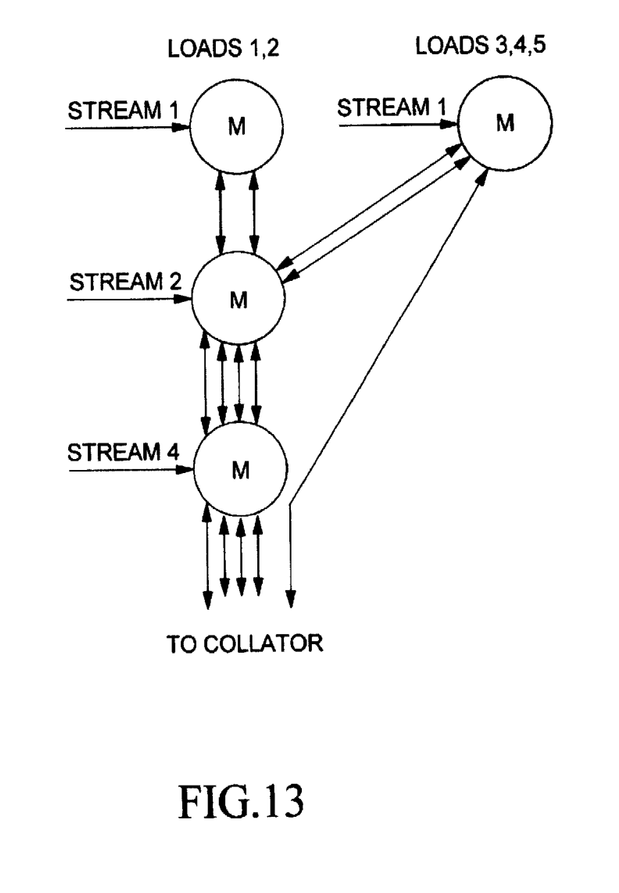
FIG. 13 is a flow chart illustrating an alternative to FIGS. 11 and 12.

FIG. 13 shows a custom distribution of loads and v-sections across the processing modules. Loads 1 and 2 have a large number of v-sections in stream 1 compared to loads 3, 4, and 5. One processor is dedicated to v-sections of loads 1 and 2 in stream 1. Another looks for stream 1 v-sections of loads 3, 4 and 5.

Figure 14:
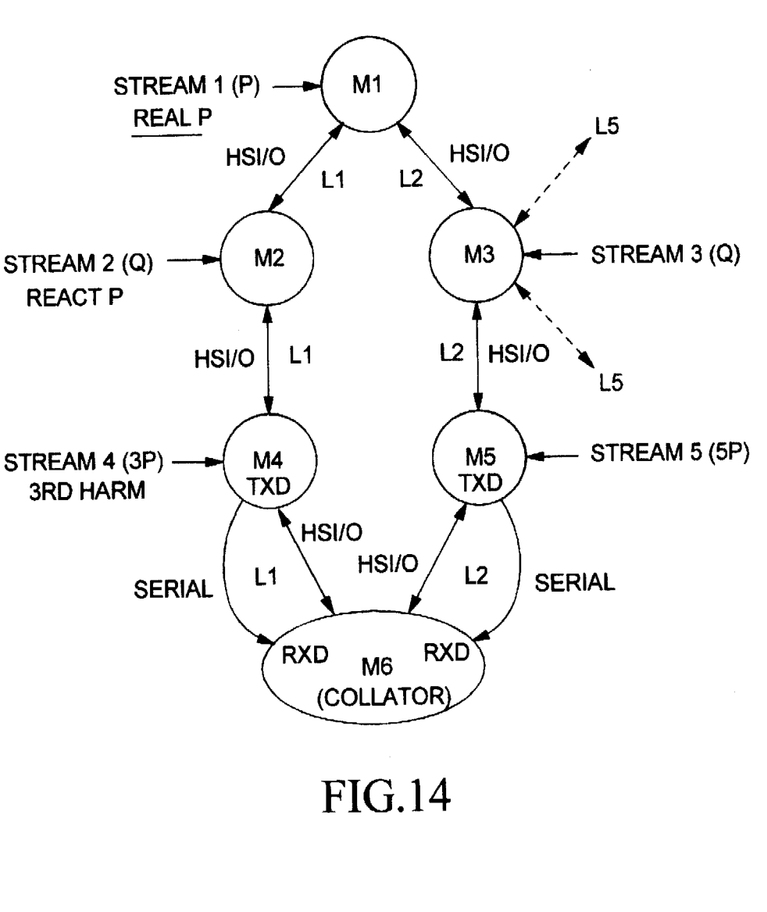
FIG. 14 is a flow chart illustrating hardware connections which is more complex than FIGS. 11–13.

Finally, FIG. 14 is a practical example showing 6 processors M1 through M6 where M1 through M5 are configured for transient event detection. Various inputs such as real or reactive power and third or fifth harmonic for a particular data stream is shown. M6 is the collator or data storage unit. Two loads, L1 and L2 are being monitored. L1 has one or more v-sections in real power or reactive power and the third harmonic. Their identification is the responsibility of M1, M2 and M4. Thus the column type load chain is M1 to M2 to M4. The load chain for L2 is similarly illustrated. Note that M1 and M2 are connected by a high speed input/output (HSI/O). The collator (for this purpose) requires only a relatively low data capacity serial connection.

Thus a nonintrusive electrical load monitor with a multi-processing transient event detector has been provided.

What is claimed is:

1. A multi-processing transient event detector for use in a nonintrusive electrical load monitoring system at the monitored site having a plurality of electrical loads wherein start-up transient pattern data associated with each electrical load being monitored has been previously stored, said transient pattern data corresponding to approximate envelopes of harmonic content of observed current or voltage waveforms produced by said plurality of electrical loads, said detector comprising:

data monitoring means for continuously monitoring total load pattern transient data at said site in parallel, to provide a plurality of data streams, said total load pattern transient data corresponding to an aggregation of said envelopes of harmonic content, each data stream having a unique load pattern related to a particular said harmonic content;

for each said data stream means for providing parallel decomposition including a plurality of single processor units in parallel with each other, each processor unit having a unique time scale to provide a corresponding envelope;

each parallel processor unit being coupled to at least one event detection processing module for processing said corresponding envelope and having a unique time scale for correlation or matching with a particular stored start-up transient pattern associated with the electrical load being monitored whereby said electrical load is identified.

2. A detector as in claim 1 wherein said harmonic content includes real in-phase power, reactive quadrature power, and other harmonics including the third and fifth in-phase harmonics.

3. A detector as in claim 1 including a plurality of parallel event detection processing modules connected to each of said decomposition processing units for processing said load patterns.

4. A detector as in claim 3 including collation means for storing said identification of electrical loads from said event detection processing modules for a particular time scale for all data streams including intrascale lockout means for preventing erroneous load identifications.

5. A detector as in claim 4 including interscale lockout means connected to all of said intrascale lockout means for preventing erroneous load identifications for all of said data streams.

6. A detector as in claim 4 wherein said data monitoring means are connected to said decomposition processor units by high data capacity digital lines and where said collation means is connected to each event detection processing module by a relatively low data capacity line.

7. A detector as in claim 1 wherein said transient pattern data associated with each electrical load being monitored is stored in the form of templates of segments of waveforms of harmonic content having significant variations from the steady state.

8. A detector as in claim 1 wherein said event detection processor module for each data stream for each time scale are series connected in a load chain to produce a load pattern data identification only if all modules for each data stream produce such an identification.

9. A method for multi-processing transient event detection for use in a nonintrusive electrical load monitoring system at the monitored site having a plurality of electrical loads wherein start-up transient pattern data associated with each electrical load being monitored has been previously stored, said transient pattern data corresponding to approximate envelopes of harmonic content of observed current or voltage waveforms produced by said plurality of electrical loads, said method comprising the steps of:

data monitoring by continuously monitoring total load pattern transient data at said sites in parallel, to provide a plurality of data streams, said total load pattern transient data corresponding to an aggregation of said envelopes of harmonic content, each data stream having a unique load pattern related to a particular said harmonic content;

for each said data stream decomposing in parallel to provide a plurality of unique time scales for each said data stream and to provide a corresponding envelope;

for each decomposed data stream having a given said time scale, event detection processing said corresponding envelope having a unique time scale for correlation or matching with a particular stored start-up transient pattern associated with the electrical load being monitored whereby said electrical load is identified.

* * * * *